(12) United States Patent
Kim et al.

(10) Patent No.: US 11,348,937 B2
(45) Date of Patent: May 31, 2022

(54) SEMICONDUCTOR DEVICE AND METHOD OF MANUFACTURING THE SEMICONDUCTOR DEVICE

(71) Applicant: SK hynix Inc., Icheon-si (KR)

(72) Inventors: Jae Taek Kim, Icheon-si (KR); Hye Yeong Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 121 days.

(21) Appl. No.: 16/918,895

(22) Filed: Jul. 1, 2020

(65) Prior Publication Data

US 2021/0217764 A1 Jul. 15, 2021

(30) Foreign Application Priority Data

Jan. 13, 2020 (KR) .......................... 10-2020-0004285

(51) Int. Cl.
*H01L 27/11573* (2017.01)
*H01L 27/11582* (2017.01)
*H01L 27/11575* (2017.01)

(52) U.S. Cl.
CPC .. *H01L 27/11573* (2013.01); *H01L 27/11582* (2013.01)

(58) Field of Classification Search
CPC ......... H01L 27/11573; H01L 27/11582; H01L 27/0629; H01L 27/11575; H01L 28/20; H01L 27/0281; H01L 29/792
See application file for complete search history.

(56) References Cited

U.S. PATENT DOCUMENTS

| | | | | |
|---|---|---|---|---|
| 2019/0252386 A1* | 8/2019 | Lee | .................. | H01L 27/10897 |
| 2019/0333923 A1* | 10/2019 | Kim | .................. | H01L 27/11582 |
| 2019/0363088 A1* | 11/2019 | Ryu | .................. | H01L 27/10894 |
| 2020/0020702 A1* | 1/2020 | Baek | ................. | H01L 27/11519 |
| 2020/0185398 A1* | 6/2020 | Shin | .................. | H01L 27/11556 |
| 2020/0295042 A1* | 9/2020 | Lim | .................. | H01L 27/11582 |
| 2020/0350330 A1* | 11/2020 | Ahn | .................. | H01L 27/11556 |
| 2021/0143154 A1* | 5/2021 | Lee | .................... | H01L 29/1037 |

FOREIGN PATENT DOCUMENTS

| | | |
|---|---|---|
| KR | 1020100013982 A | 2/2010 |
| KR | 1020130070153 A | 6/2013 |

* cited by examiner

*Primary Examiner* — Shahed Ahmed
*Assistant Examiner* — Khatib A Rahman
(74) *Attorney, Agent, or Firm* — William Park & Associates Ltd.

(57) ABSTRACT

The present technology provides a semiconductor device and a method of manufacturing the semiconductor device. The semiconductor device includes a cell source structure, a first stack disposed on the cell source structure and including insulating patterns and conductive patterns that are alternately stacked with each other, a peripheral source structure, and a resistor pattern disposed on the peripheral source structure. The resistor pattern is disposed at substantially the same level as a lowermost insulating pattern of the first stack.

20 Claims, 11 Drawing Sheets

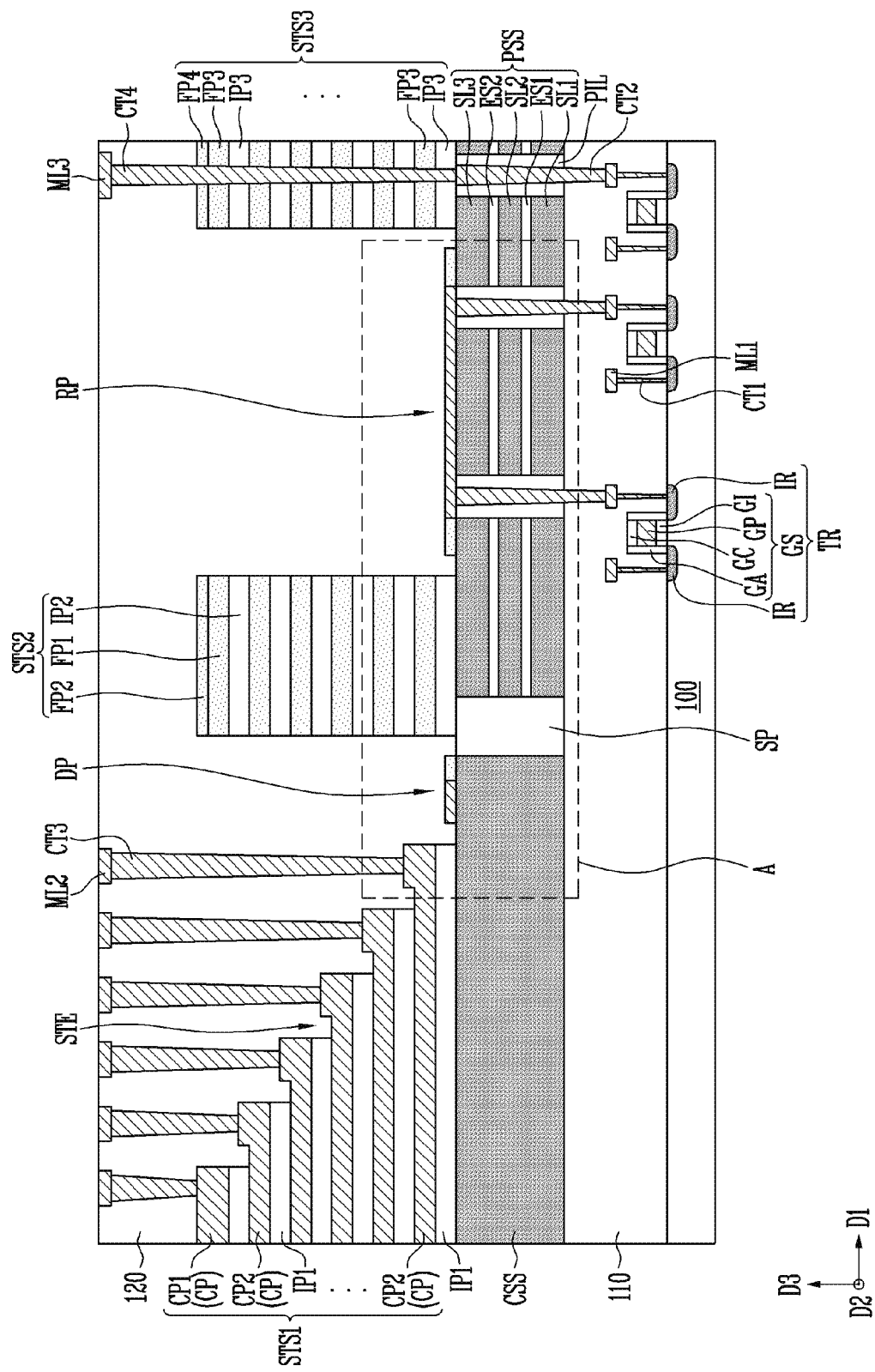

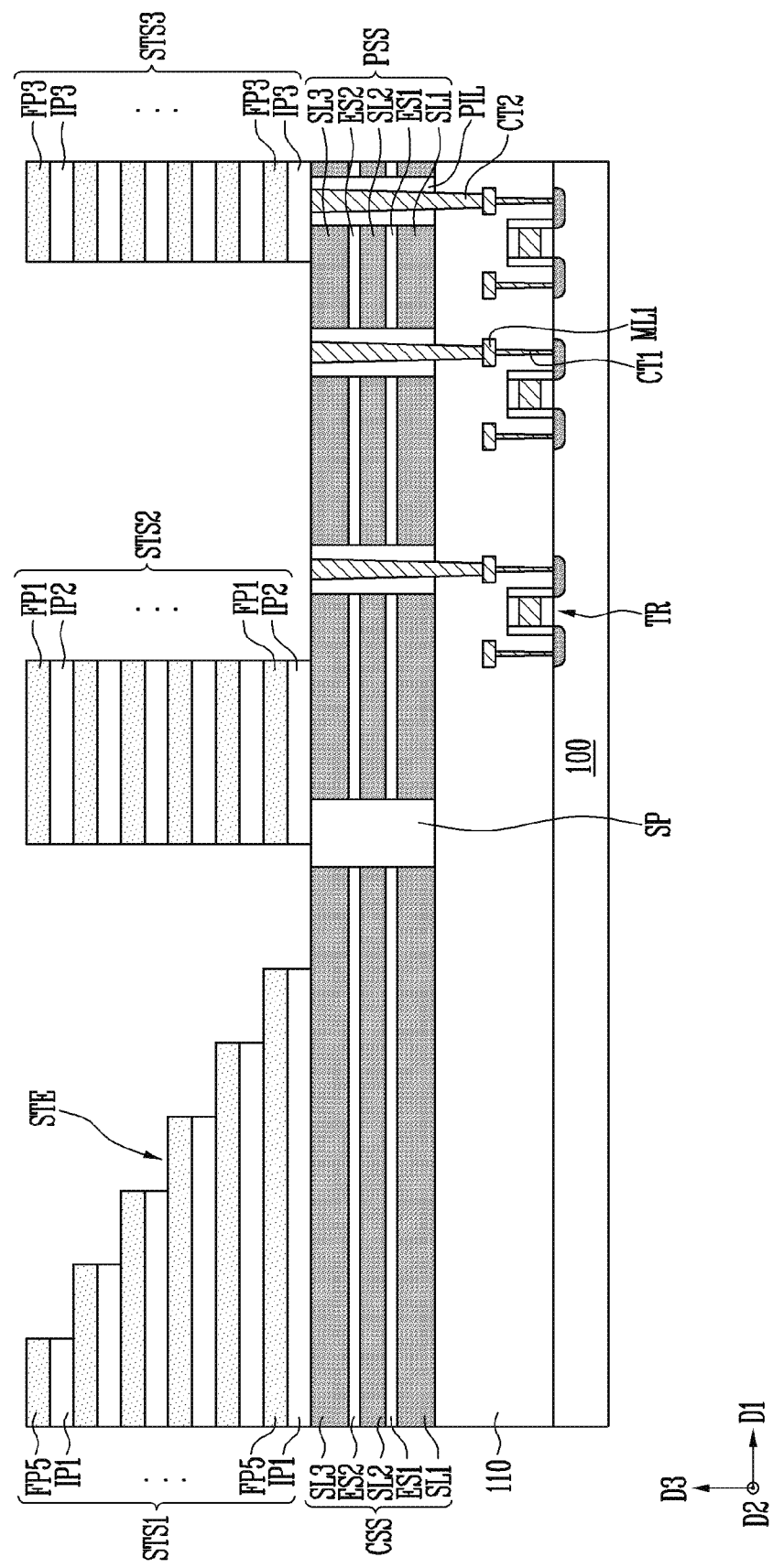

SEMICONDUCTOR DEVICE AND METHOD OF MANUFACTURING THE SEMICONDUCTOR DEVICE

CROSS-REFERENCE TO RELATED APPLICATION

The present application claims priority under 35 U.S.C. § 119(a) to Korean patent application number 10-2020-0004285, filed on Jan. 13, 2020, in the Korean Intellectual Property Office, the entire disclosure of which is incorporated herein by reference.

BACKGROUND

1. Technical Field

The present disclosure relates to a semiconductor device and a method of manufacturing the same, and more particularly, to a three-dimensional semiconductor device and a method of manufacturing the semiconductor device.

2. Related Art

A semiconductor device includes an integrated circuit configured of a metal oxide semiconductor field effect transistor (MOSFET). As a size and design rule of the semiconductor device are gradually reduced, scale down of the MOSFETs is also gradually accelerating.

The size reduction of the MOSFETs may cause a short channel effect, or the like, and thus an operation characteristic of the semiconductor device may be degraded. Accordingly, various methods for forming a semiconductor device having better performance while overcoming a limitation due to high integration of the semiconductor device have been studied.

Furthermore, such an integrated circuit aims at reliability of an operation and low power consumption. Therefore, a method for device having higher reliability and lower power consumption in a smaller space is also being studied.

SUMMARY

A semiconductor device according to an embodiment of the present disclosure may include a cell source structure, a first stack disposed on the cell source structure and including insulating patterns and conductive patterns that are alternately stacked with each other, a peripheral source structure, and a resistor pattern disposed on the peripheral source structure. The resistor pattern may be disposed at substantially the same level as a lowermost insulating pattern of the first stack.

A semiconductor device according to an embodiment of the present disclosure may include a peripheral transistor, an insulating film covering the peripheral transistor, a cell source structure and a peripheral source structure on the insulating film, a first stack disposed on the cell source structure and including insulating patterns and conductive patterns that are alternately stacked with each other, a resistor pattern on the peripheral source structure, and a second contact passing through the peripheral source structure to electrically connect the peripheral transistor and the resistor pattern to each other.

A method of manufacturing a semiconductor device according to an embodiment of the present disclosure may include forming a first stack including first sacrificial patterns and insulating patterns on the cell source structure, forming a sacrificial film covering the first stack, the cell source structure, and the peripheral source structure, forming a second sacrificial pattern on the first stack and a resistor pattern on the peripheral source structure by patterning the sacrificial film, and forming a conductive portion in the resistor pattern.

A method of manufacturing a semiconductor device according to an embodiment of the present disclosure may include forming a cell source structure and a peripheral source structure, forming a preliminary stack on the cell source structure and the peripheral source structure, patterning the preliminary stack to expose an upper surface of the peripheral source structure, forming a resistor pattern on the upper surface of the peripheral source structure, and forming a conductive portion in the resistor pattern.

BRIEF DESCRIPTION OF THE DRAWINGS

FIG. 1A is a cross-sectional view of a semiconductor device according to an embodiment of the present disclosure.

FIGS. 2A, 2B, 2C, 2D, 2E, 2F, 2G, and 2H are cross-sectional views for describing a method of manufacturing the semiconductor device according to an embodiment of the present disclosure.

DETAILED DESCRIPTION

Figure 1B:
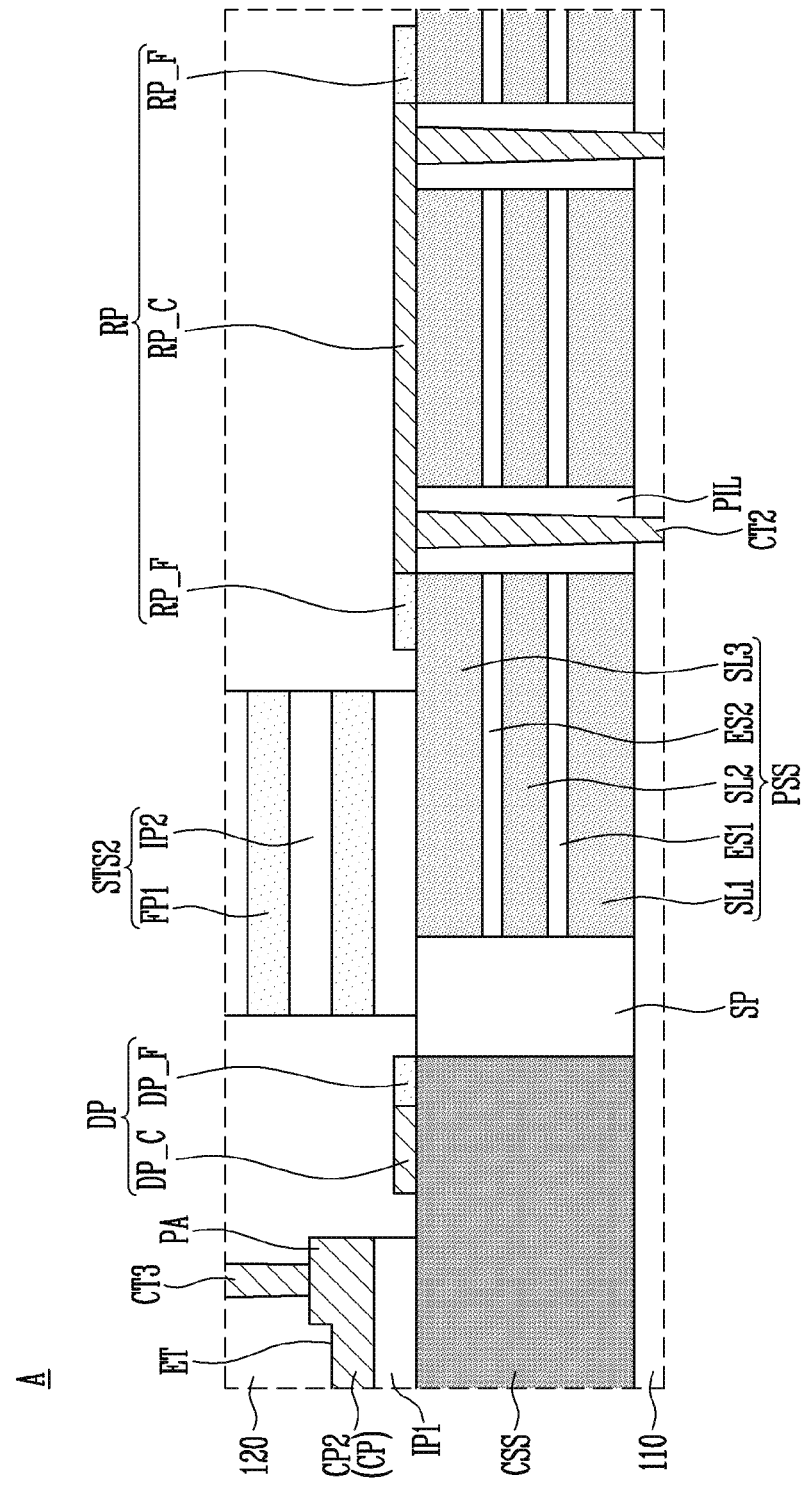
FIG. 1B is an enlarged view of a region A of FIG. 1A.

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as limited to the embodiments described in the present specification or application.

Hereinafter, various examples of embodiments will be described below with reference to the accompanying drawings. Various examples of the embodiments are described herein with reference to cross-sectional illustrations that are schematic illustrations of the various examples of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component.

It will be understood that, although the terms first, second, third etc. may be used herein to describe various elements, components, regions, layers, patterns, films, structures, stacks, contacts, wires, portions, and/or sections, these elements, components, regions, layers, patterns, films, structures, stacks, contacts, wires, portions, and/or sections should not be limited by these terms. These terms are only used to distinguish one elements, components, regions, layers, patterns, films, structures, stacks, contacts, wires, portions, and/or sections from another element, component, region, layer, pattern, film, structure, stack, contact, wire, portion, and/or section. Thus, a first element, component, region, layer, pattern, film, structure, stack, contact, wire, portion, and/or section discussed below could be termed a second element, component, region, layer, pattern, film, structure, stack, contact, wire, portion, and/or section without departing from the teachings of the present disclosure.

Embodiments of the present disclosure provides a semiconductor device and a method of manufacturing the same capable of improving operation reliability.

In the semiconductor device according to embodiments, the resistor pattern may be formed on the peripheral source structure. Accordingly, operation reliability of the semiconductor device according to the present technology may be improved.

FIG. 1A is a cross-sectional view of a semiconductor device according to an embodiment of the present disclosure. FIG. 1B is an enlarged view of a region A of FIG. 1A.

Referring to FIGS. 1A and 1B, the semiconductor device according to an embodiment may include a substrate 100. The substrate 100 may have a form of a plate extending along a plane defined by a first direction D1 and a second direction D2. The first direction D1 and the second direction D2 may cross each other. For example, the first direction D1 and the second direction D2 may be perpendicular to each other. For example, the substrate 100 may be a semiconductor substrate. For example, the substrate 100 may be a bulk silicon substrate, a silicon on insulator substrate, a germanium substrate, a germanium on insulator substrate, a silicon-germanium substrate, or an epitaxial thin film formed through a selective epitaxial growth method.

A first insulating film 110 may be provided on the substrate 100. The first insulating film 110 may have a form of a plate extended along a plane defined by the first direction D1 and the second direction D2. The insulating film 110 may include an insulating material. For example, the first insulating film 110 may include oxide or nitride.

Peripheral transistors TR may be provided on the substrate 100. The peripheral transistors TR may be provided between the substrate 100 and the first insulating film 110. The peripheral transistors TR may be covered by the first insulating film 110. Each of the peripheral transistors TR may include impurity regions IR and a gate structure GS. The impurity regions IR may be a portion of the substrate 100. The impurity regions IR may be formed by doping an impurity into the substrate 100. The gate structure GS may be disposed between the impurity regions IR.

The gate structure GS may include a gate pattern GP, a gate insulating film GI, a gate capping film GC, and gate spacers GA. The gate insulating film GI may be disposed between the gate pattern GP and the substrate 100. The gate pattern GP may be electrically spaced apart from the substrate 100 by the gate insulating film GI. An upper surface of the gate pattern GP may be covered by the gate capping film GC. The gate spacers GA may be disposed on both sides of the gate insulating film GI, the gate capping film GC, and the gate pattern GP. The gate insulating film GI, the gate capping film GC, and the gate pattern GP may be disposed between the gate spacers GA.

The gate pattern GP may include a conductive material. For example, the gate pattern GP may include a metal or a conductive semiconductor material. The gate spacers GA, the gate insulating film GI, and the gate capping film GC may include an insulating material. For example, the gate spacers GA, the gate insulating film GI, and the gate capping film GC may include oxide. A channel may be formed between the impurity regions IR, by an operation of the peripheral transistor TR. The peripheral transistor TR may be an NMOS transistor or a PMOS transistor.

The peripheral transistors TR may be used as elements of a peripheral circuit including a row decoder, a column decoder, a page buffer circuit, and an input/output circuit of the semiconductor device.

First contacts CT1 and first wires ML1 may be provided in the first insulating film 110. The first contacts CT1 may be connected to the peripheral transistors TR. The first contacts CT1 may be connected to the impurity regions IR, respectively. The first wires ML1 may be connected to the first contacts CT1. The first contacts CT1 and the first wires ML1 may include a conductive material. For example, the first contacts CT1 and the first wires ML1 may include copper, tungsten, or aluminum.

A cell source structure CSS may be provided on the first insulating film 110. The cell source structure CSS may have a form of a plate extending along a plane defined by the first direction D1 and the second direction D2. The cell source structure CSS may be used as a source line connected to a memory cell.

The cell source structure CSS may include a conductive material. For example, the cell source structure CSS may include doped polysilicon. For example, the cell source structure CSS may include an N-type dopant. The cell source structure CSS may be a single film or multiple films.

A peripheral source structure PSS may be provided on the first insulating film 110. The peripheral source structure PSS may have a form of a plate extending along a plane defined by the first direction D1 and the second direction D2. The peripheral source structure PSS may be disposed on the same plane as the cell source structure CSS. The peripheral source structure PSS may be disposed at the same level as the cell source structure CSS. In an embodiment, the peripheral source structure PSS may be disposed at substantially the same level as the cell source structure CSS. The peripheral transistor TR may be provided under the peripheral source structure PSS.

A spacer SP may be provided on the first insulating film 110. The spacer SP may be disposed between the cell source structure CSS and the peripheral source structure PSS. The cell source structure CSS and the peripheral source structure PSS may be spaced apart from each other in the first direction D1 by the spacer SR The cell source structure CSS and the peripheral source structure PSS may be electrically separated by the spacer SP. The spacer SP may extend in the second direction D2. The spacer SP may include an insulating material. For example, the spacer SP may include oxide.

The peripheral source structure PSS may include a first source film SL1, a first etch stop film ES1, a second source film SL2, a second etch stop film ES2, and a third source film SL3, which are sequentially stacked in a third direction D3. The third direction D3 may cross the first direction D1 and the second direction D2. For example, the third direction D3 may be perpendicular to the first direction D1 and the second direction D2. The first etch stop film ES1 may be provided between the first and second source films SL1 and SL2. The second etch stop film ES2 may be provided between the second and third source films SL2 and SL3. The second source film SL2 may be provided between the first and third source films SL1 and SL3.

The first to third source films SL1, SL2, and SL3 may include a semiconductor material. For example, the first to third source films SL1, SL2, and SL3 may include polysilicon. The first and second etch stop films ES1 and ES2 may include an insulating material. For example, the first and second etch stop films ES1 and ES2 may include oxide or a high dielectric constant (high-k) material. For example, the high dielectric constant material may be $Al_2O_3$.

Through insulating films PIL passing through the peripheral source structure PSS may be provided. The through insulating films PIL may extend in the third direction D3. The through insulating films PIL may pass through the first source film SL1, the first etch stop film ES1, the second source film SL2, the second etch stop film ES2, and the third source film SL3 of the peripheral source structure PSS in the third direction D3.

A lower surface of the through insulating film PIL may contact an upper surface of the first insulating film 110. The peripheral source structure PSS may surround the through insulating film PIL. The peripheral source structure PSS may surround a sidewall of the through insulating film PIL. The through insulating film PIL may include an insulating material. For example, the through insulating film PIL may include oxide.

Second contacts CT2 passing through the through insulating films PIL may be provided. The second contacts CT2 may pass through the peripheral source structure PSS. The second contacts CT2 may extend in the third direction D3. The second contacts CT2 may pass through the first source film SL1, the first etch stop film ES1, the second source film SL2, the second etch stop film ES2, and the third source film SL3 of the peripheral source structure PSS in the third direction D3.

The second contact CT2 may be connected to the first wire ML1. The second contact CT2 may be electrically connected to the impurity region IR of the peripheral transistor TR through the first wire ML1 and the first contact CT1. A lower surface of the second contact CT2 may contact an upper surface of the first wire ML1. The through insulating film PIL may surround the second contact CT2. The through insulating film PIL may surround an upper portion of a sidewall of the second contact CT2. The first insulating film 110 may surround the second contact CT2. The first insulating film 110 may surround a lower portion of the sidewall of the second contact CT2. The second contact CT2 may include a conductive material. For example, the second contact CT2 may include copper, tungsten, or aluminum.

A first stack STS1 may be provided on the cell source structure CSS. The first stack STS1 may include first insulating patterns IP1 and conductive patterns CP that are alternately stacked with each other in the third direction D3.

The first insulating patterns IP1 may include an insulating material. For example, the first insulating patterns IP1 may include oxide. The conductive patterns CP may include a conductive film. The conductive film may include a conductive material. For example, the conductive film may include at least one of a doped silicon film, a metal silicide film, tungsten, nickel, and cobalt. The conductive film may be used as a word line connected to a memory cell or a select line connected to a select transistor. The conductive patterns CP may further include a barrier film surrounding the conductive film. For example, the barrier film may include at least one of titanium nitride and tantalum nitride.

The conductive patterns CP may include a first conductive pattern CP1 and a second conductive pattern CP2. The conductive pattern CP disposed on the uppermost portion of the first stack STS1 may be defined as the first conductive pattern CP1, and the conductive patterns CP under the first conductive pattern CP1 may be defined as the second conductive pattern CP2. The second conductive patterns CP2 may be disposed between the first conductive pattern CP1 and the cell source structure CSS. A thickness of the first conductive pattern CP1 may be greater than a thickness of each of the second conductive patterns CP2.

The first stack STS1 may include a step shape structure STE. The first insulating patterns IP1 and the conductive patterns CP of the first stack STS1 may be formed in a step shape, and thus the step shape structure STE may be formed. A portion of an upper surface of the second conductive pattern CP2 might not be covered by the first insulating pattern IP1. The portion of the upper surface of the second conductive pattern CP2, which is not covered by the first insulating pattern IP1, may be defined as an exposed upper surface ET. The exposed upper surface ET may be in contact with a second insulating film 120 that will be described later.

Each of the second conductive patterns CP2 may include a pad portion PA protruding in the third direction D3. The pad portion PA may protrude from the upper surface of the second conductive pattern CP2. The pad portion PA may protrude from the exposed upper surface ET of the second conductive pattern CP2 in the third direction D3. The pad portion PA may be disposed at an end portion of the second conductive pattern CP2. The pad portion PA may be a portion of the second conductive pattern CP2.

Channel structures (not shown) passing through the first stack STS1 may be provided. The channel structures may pass through the first insulating patterns IP1 and the conductive patterns CP of the first stack STS1. The channel structures may extend in the third direction D3. The channel structure may be electrically connected to the cell source structure CSS.

Each of the channel structures may include a channel film passing through the first stack STS1, and a memory film surrounding the channel film. The channel film may include a semiconductor material. For example, the channel film may include polysilicon.

The memory film may include insulating films of multiple layers. The memory film may include a tunnel film surrounding the channel film, a storage film surrounding the tunnel film, and a blocking film surrounding the storage film. The tunnel film may include an insulating material capable of charge tunneling. For example, the tunnel film may include oxide.

The storage film may include nitride in which charge may be trapped. The material included in the storage film might not be limited to nitride, and may be variously changed according to a data storage method. For example, the storage film may include one of silicon, a phase change material, and nanodot.

The blocking film may include an insulating material capable of blocking transferal of charge. For example, the blocking film may include oxide. A thickness of the tunnel film may be thinner than a thickness of the blocking film.

The channel structure may further include a filling film in the channel film. The filling film may include an insulating material. For example, the filling film may include oxide.

A dummy pattern DP may be provided on an upper surface of the cell source structure CSS. The dummy pattern DP may be disposed at the same level as the first insulating pattern IP1 of the lowermost portion of the first stack STS1.

For example, a level of a portion of the dummy pattern DP and a level of a portion of the first insulating pattern IP1 of the lowermost portion of the first stack STS1 may be the same. A level of a lower surface of the dummy pattern DP may be the same as a level of a lower surface of the first stack STS1. The level of the lower surface of the dummy pattern DP may be the same as a level of a lower surface of the first insulating pattern IP1 of the lowermost portion of the first stack STS1. A level of an upper surface of the dummy pattern DP may be lower than a level of an upper surface of the first insulating pattern IP1 of the lowermost portion of the first stack STS1.

The dummy pattern DP may be disposed between the spacer SP and the first stack STS1. The dummy pattern DP may be spaced apart from the first stack STS1 in the first direction D1.

The dummy pattern DP may include a first conductive portion DP_C and a first sacrificial portion DP_F. A portion of the dummy pattern DP adjacent to the first stack STS1 may be defined as the first conductive portion DP_C. A portion of the dummy pattern DP adjacent to the spacer SP may be defined as the first sacrificial portion DP_F.

The first conductive portion DP_C may include the same material as the conductive pattern CP. The first conductive portion DP_C may include a conductive film and a barrier film identically to the conductive pattern CP. For example, the conductive film of the first conductive portion DP_C may include at least one of a doped silicon film, a metal silicide film, tungsten, nickel, and cobalt. For example, the barrier film of the first conductive portion DP_C may include at least one of titanium nitride and tantalum nitride.

The first sacrificial portion DP_F may include an insulating material. For example, the first sacrificial portion DP_F may include nitride.

A second stack STS2 may be provided on the spacer SP and the peripheral source structure PSS. The second stack STS2 may include second insulating patterns IP2 and first sacrificial patterns FP1 that are alternately stacked with each other in the third direction D3.

The second insulating patterns IP2 may include an insulating material. For example, the second insulating patterns IP2 may include oxide. The first sacrificial patterns FP1 may include an insulating material. For example, the first sacrificial patterns FP1 may include nitride.

The second stack STS2 may further include a second sacrificial pattern FP2 at the uppermost portion thereof. The second sacrificial pattern FP2 may be provided on the first sacrificial pattern FP1. A thickness of the second sacrificial pattern FP2 may be less than a thickness of the first sacrificial pattern FP1. The second sacrificial pattern FP2 may include an insulating material. For example, the second sacrificial pattern FP2 may include nitride.

A resistor pattern RP may be provided on an upper surface of the peripheral source structure PSS. The resistor pattern RP may extend in the first direction D1. The resistor pattern RP may be in contact with the second contact CT2 and the through insulating film PIL.

The resistor pattern RP may include a second conductive portion RP_C and second sacrificial portions RP_F. Both side end portions of the resistor pattern RP may be defined as the second sacrificial portions RP_F. An intermediate portion of the resistor pattern RP may be defined as the second conductive portion RP_C. The second sacrificial portions RP_F may be disposed on both sides of the second conductive portion RP_C. The second sacrificial portions RP_F may be spaced apart from each other in the first direction D1. The second conductive portion RP_C may connect the second sacrificial portions RP_F to each other between the second sacrificial portions RP_F.

The resistor pattern RP may be disposed at the same level as the dummy pattern DP. For example, a level of a portion of the resistor pattern RP and a level of a portion of the dummy pattern DP may be the same. A level of an upper surface of the resistor pattern RP may be the same as the level of the upper surface of the dummy pattern DR A level of a lower surface of the resistor pattern RP may be the same as the level of the lower surface of the dummy pattern DR In an embodiment, the resistor pattern RP may be disposed at substantially the same level as the dummy pattern DR For example, a level of a portion of the resistor pattern RP and a level of a portion of the dummy pattern DP may be substantially the same. In an embodiment, a level of an upper surface of the resistor pattern RP may be substantially the same as the level of the upper surface of the dummy pattern DR In an embodiment, a level of a lower surface of the resistor pattern RP may be substantially the same as the level of the lower surface of the dummy pattern DP.

The level of the lower surface of the resistor pattern RP may be the same as the level of the lower surfaces of the first stack STS1 and the second stack STS2. The resistor pattern RP may be disposed at the same level as the first insulating pattern IP1 of the lowermost portion of the first stack STS1 and the second insulating pattern IP2 of the lowermost portion of the second stack STS2. For example, a level of a portion of the resistor pattern RP, a level of a portion of the first insulating pattern IP1 of the lowermost portion of the first stack STS1, and a level of a portion of the second insulating pattern IP2 of the lowermost portion of the second stack STS2 may be the same. The level of the upper surface of the resistor pattern RP may be lower than the level of the level of the upper surface of the first insulating pattern IP1 of the lowermost portion of the first stack STS1 and the level of the upper surface of the second insulating pattern IP2 of the lowermost portion of the second stack STS2. The level of the lower surface of the resistor pattern RP may be the same as the level of the lower surface of the first insulating pattern IP1 of the lowermost portion of the first stack STS1 and the level of the lower surface of the second insulating pattern IP2 of the lowermost portion of the second stack STS2. In an embodiment, the level of the lower surface of the resistor pattern RP may be substantially the same as the level of the lower surfaces of the first stack STS1 and the second stack STS2. In an embodiment, the resistor pattern RP may be disposed at substantially the same level as the first insulating pattern IP1 of the lowermost portion of the first stack STS1 and the second insulating pattern IP2 of the lowermost portion of the second stack STS2. For example, a level of a portion of the resistor pattern RP, a level of a portion of the first insulating pattern IP1 of the lowermost portion of the first stack STS1, and a level of a portion of the second insulating pattern IP2 of the lowermost portion of the second stack STS2 may be substantially the same. In an embodiment, the level of the lower surface of the resistor pattern RP may be substantially the same as the level of the lower surface of the first insulating pattern IP1 of the lowermost portion of the first stack STS1 and the level of the lower surface of the second insulating pattern IP2 of the lowermost portion of the second stack STS2.

The second conductive portion RP_C may include a conductive material. The second conductive portion RP_C may include the same material as the conductive pattern CP and the first conductive portion DP_C. The second conductive portion RP_C may include a conductive film and a barrier film identically to the conductive pattern CP and the first conductive portion DP_C. For example, the conductive film of the second conductive portion RP_C may include at least one of a doped silicon film, a metal silicide film, tungsten, nickel, and cobalt. For example, the barrier film of the second conductive portion RP_C may include at least one of titanium nitride and tantalum nitride.

The second sacrificial portion RP_F may include an insulating material. For example, the second sacrificial portion RP_F may include nitride.

The second conductive portion RP_C may be connected to the second contacts CT2. The second contacts CT2 may be connected to both end portions of the second conductive portion RP_C. The second conductive portion RP_C may be electrically connected to the peripheral transistors TR through the second contacts CT2, the first wires ML1, and the first contacts CT1. The second conductive portion RP_C may transfer a voltage between the peripheral transistors TR and may be used as a resistor connected between the peripheral transistors TR.

A third stack STS3 may be provided on the peripheral source structure PSS. The third stack STS3 may include third insulating patterns IP3 and third sacrificial patterns FP3 that are alternately stacked with each other in the third direction D3.

The third insulating patterns IP3 may include an insulating material. For example, the third insulating patterns IP3 may include oxide. The third sacrificial patterns FP3 may include an insulating material. For example, the third sacrificial patterns FP3 may include nitride.

The third stack STS3 may further include a fourth sacrificial pattern FP4 at the uppermost portion thereof. The fourth sacrificial pattern FP4 may be provided on the third sacrificial pattern FP3. A thickness of the fourth sacrificial pattern FP4 may be less than a thickness of the third sacrificial pattern FP3. The fourth sacrificial pattern FP4 may include an insulating material. For example, the fourth sacrificial pattern FP4 may include nitride.

A second insulating film 120 may be provided on the cell source structure CSS and the peripheral source structure PSS. The second insulating film 120 may cover the first stack STS1, the dummy pattern DP, the second stack STS2, the resistor pattern RP, and the third stack STS3. The second insulating film 120 may include an insulating material. For example, the second insulating film 120 may include oxide.

Third contacts CT3 connected to the conductive patterns CP of the first stack STS1 may be provided. The third contacts CT3 may be spaced apart from each other in the first direction D1. The third contacts CT3 may extend in the third direction D3. Lengths of each of the third contacts CT3 extending in the third direction D3 may be different from each other. The third contacts CT3 connected to the second conductive patterns CP2 may be connected to the pad portions PA of the second conductive patterns CP2. The third contacts CT3 may include a conductive material. For example, the third contacts CT3 may include copper, aluminum, or tungsten.

Second wires ML2 connected to the third contacts CT3 may be provided. The second wires ML2 may include a conductive material. For example, the second wires ML2 may include copper, aluminum, or tungsten.

Fourth contact CT4 passing through the third stack STS3 may be provided. The fourth contact CT4 may pass through the third insulating patterns IP3, the third sacrificial patterns FP3, and the fourth sacrificial pattern FP4 of the third stack STS3. The fourth contact CT4 may be connected to the second contact CT2. The fourth contact CT4 may be electrically connected to the peripheral transistor TR through the second contact CT2, the first wire ML1, and the first contact CT1. The fourth contact CT4 may include a conductive material. For example, the fourth contact CT4 may include copper, aluminum, or tungsten.

A third wire ML3 connected to the fourth contact CT4 may be provided. The third wire ML3 may include a conductive material. For example, the third wire ML3 may include copper, aluminum, or tungsten.

In the semiconductor device according to an embodiment, the second conductive portion RP_C of the resistor pattern RP, which is used as a portion of configurations of the resistor of the semiconductor device, may be disposed on the peripheral source structure PSS. Accordingly, space utilization of the semiconductor device may be improved, and operation reliability of the semiconductor device may be improved.

FIGS. 2A to 2H are cross-sectional views for describing a method of manufacturing the semiconductor device according to an embodiment of the present disclosure.

For brevity of description, the same reference numerals are used for the components described with reference to FIGS. 1A and 1B, and repetitive description is omitted. The manufacturing method described below may be only one embodiment of the method of manufacturing the semiconductor device according to FIGS. 1A and 1B, and the method of manufacturing the semiconductor device according to FIGS. 1A and 1B might not be limited to the manufacturing method described below.

Figure 2A:
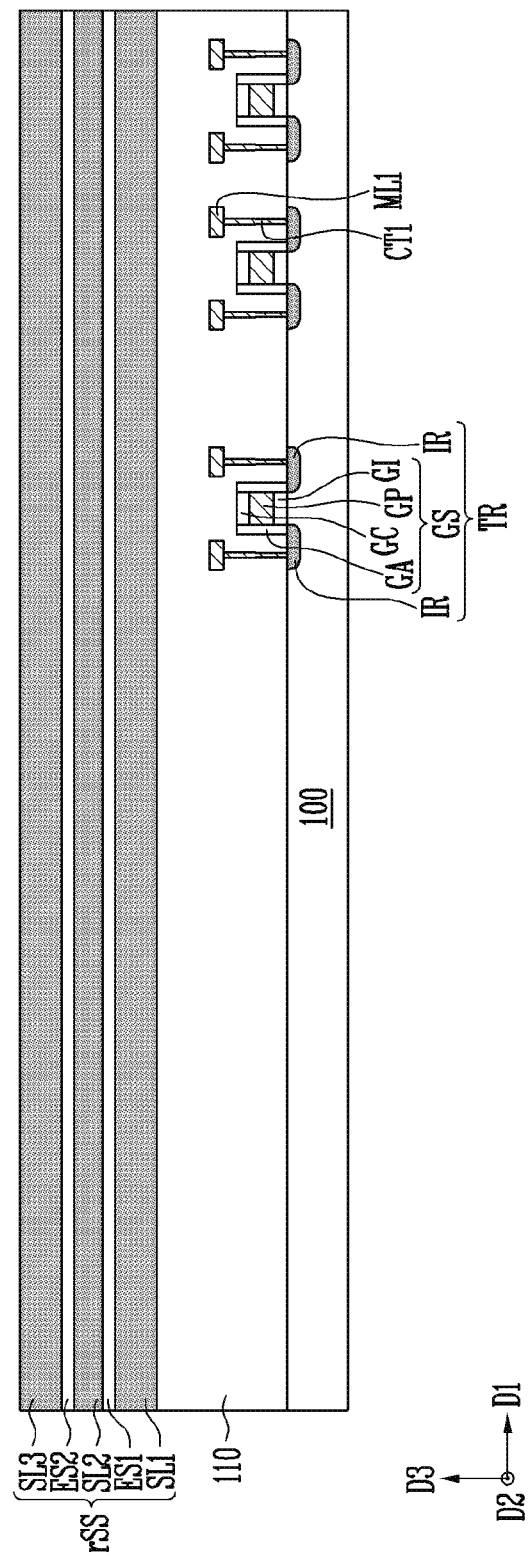

Referring to FIG. 2A, the peripheral transistors TR and the first insulating film 110 may be formed on the substrate 100. The peripheral transistor TR may include the impurity regions IR and the gate structure GS. The gate structure GS may include the gate spacers GA, the gate pattern GP, the gate insulating film GI, and the gate capping film GC. The first contacts CT1 and the first wires ML1 connected to the peripheral transistors TR may be formed in the first insulating film 110.

A preliminary source structure rSS may be formed on the first insulating film 110. The preliminary source structure rSS may include the first source film SL1, the first etch stop film ES1, the second source film SL2, the second etch stop film ES2, and the third source film SL3 which are sequentially stacked in the third direction D3.

The first and second etch stop films ES1 and ES2 may include an insulating material. For example, the first and second etch stop films ES1 and ES2 may include oxide or a high dielectric constant material. The first to third source films SL1, SL2, and SL3 may include a semiconductor material. For example, the first to third source films SL1, SL2, and SL3 may include polysilicon.

Figure 2B:
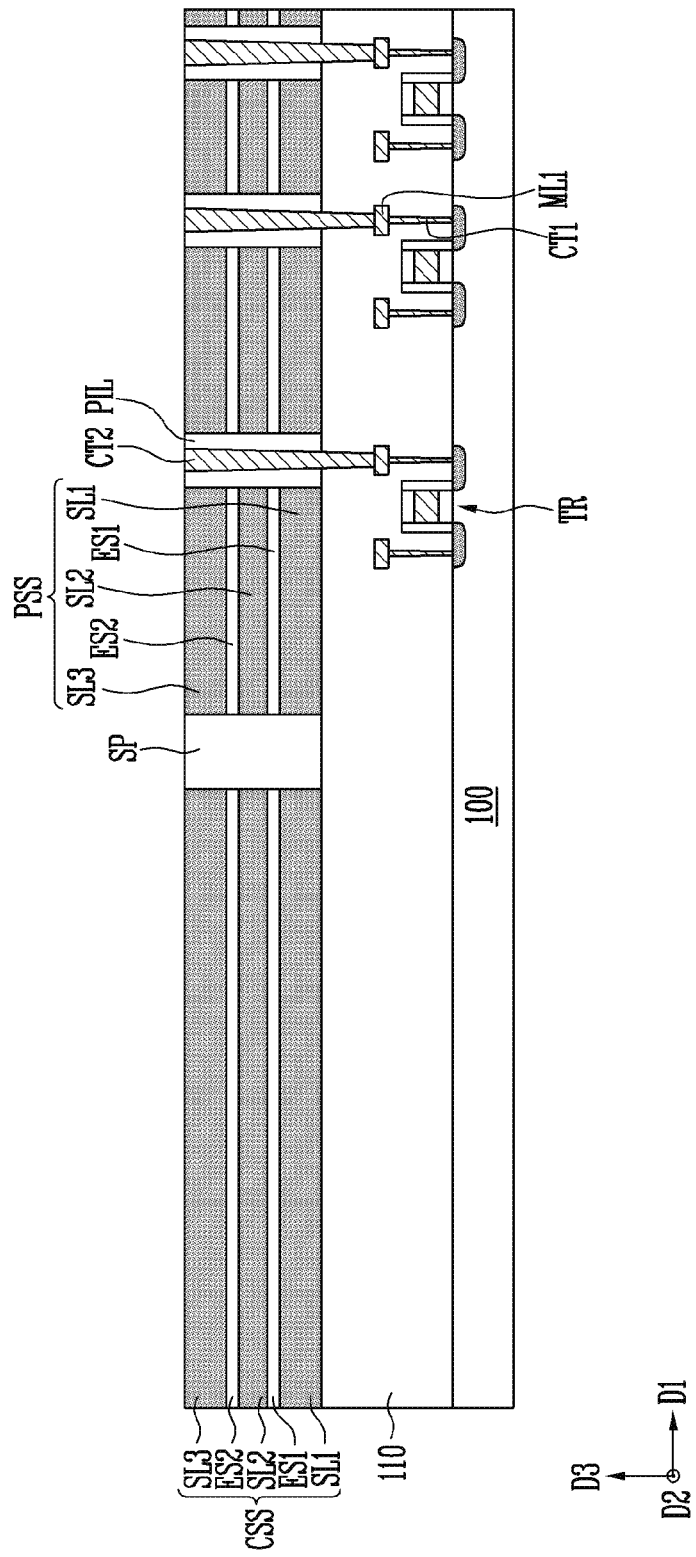

Referring to FIG. 2B, the spacer SP passing through the preliminary source structure rSS may be formed. The preliminary source structure rSS may be separated by the spacer SP, and thus the cell source structure CSS and the peripheral source structure PSS may be formed. The cell source structure CSS and the peripheral source structure PSS may be spaced apart from each other in the first direction D1 by the spacer SP.

The cell source structure CSS and the peripheral source structure PSS may include the first source film SL1, the first etch stop film ES1, the second source film SL2, the second etch stop film ES2, and the third source film SL3 which are sequentially stacked in the third direction D3.

Forming the spacer SP may include forming a first trench passing through the preliminary source structure rSS, and forming an insulating material in the first trench. The first trench may extend in the second direction D2.

The through insulating films PIL passing through the peripheral source structure PSS, and the second contacts CT2 may be formed. The through insulating films PIL and the second contacts CT2 may be surrounded by the peripheral source structure PSS.

Forming the through insulating film PIL may include forming a first hole passing through the peripheral source structure PSS, and forming an insulating material in the first hole.

Forming the second contact CT2 may include forming a second hole passing through the through insulating film PIL and connected to the first wire ML1, and forming a conductive material in the second hole.

Figure 2C:
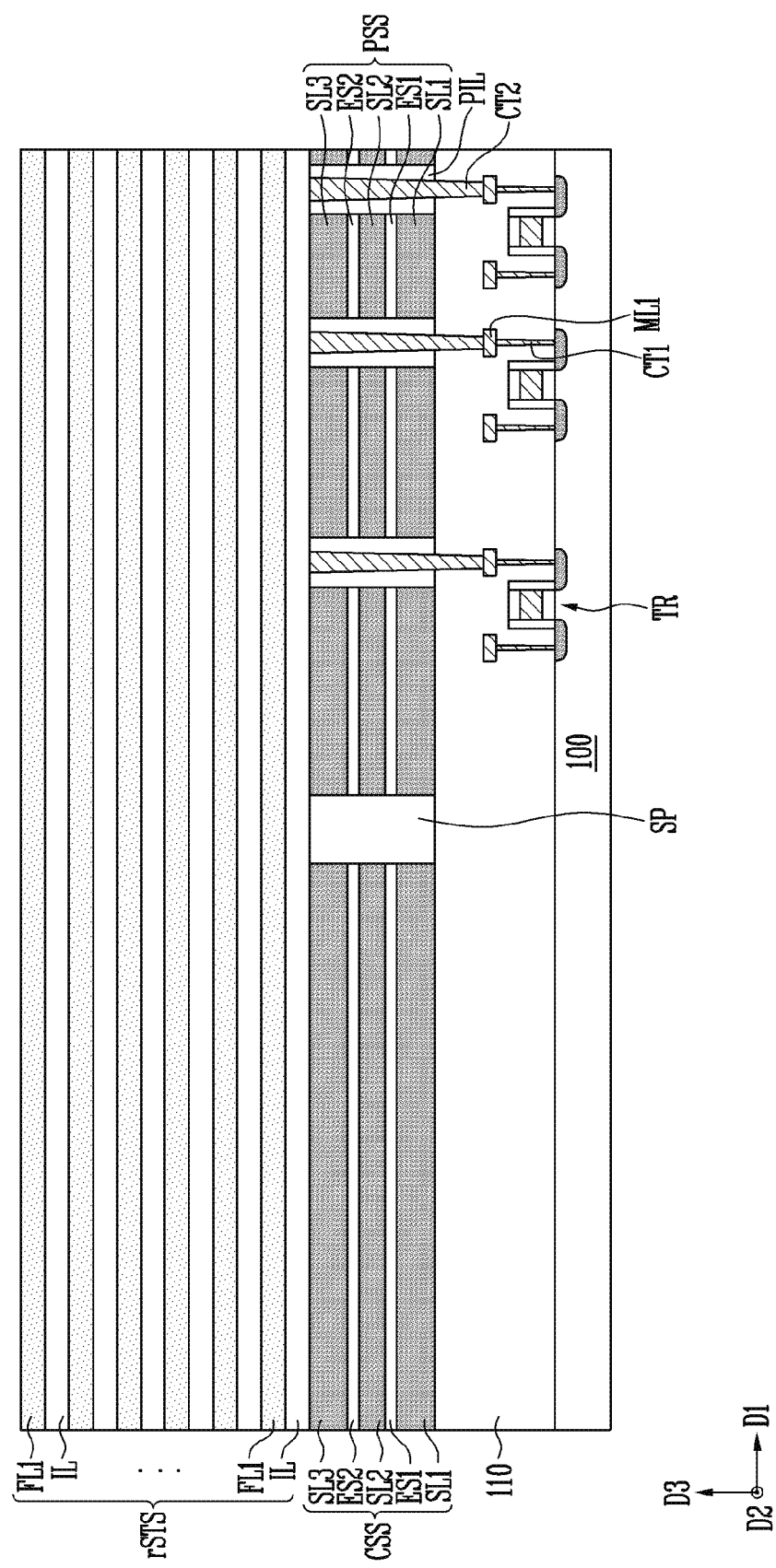

Referring to FIG. 2C, the preliminary stack rSTS may be formed on the cell source structure CSS and the peripheral source structure PSS. The preliminary stack rSTS may include the insulating films IL and the first sacrificial films FL1 that are alternately stacked with each other in the third direction D3. The insulating films IL may include an insulating material. For example, the insulating films IL may include oxide. The first sacrificial films FL1 may include an insulating material. For example, the first sacrificial films FL1 may include nitride.

After forming the preliminary stack rSTS, the channel structure including the channel film and the memory film may be formed. The channel structure may pass through the preliminary stack rSTS.

Referring to FIG. 2D, the first stack STS1, the second stack STS2, and the third stack STS3 may be formed. The first stack STS1, the second stack STS2, and the third stack STS3 may be formed by patterning the preliminary stack rSTS.

The first stack STS1, the second stack STS2, and the third stack STS3 may be spaced apart from each other in the first direction D1. The upper surface of the cell source structure CSS and an upper surface of the spacer SP may be exposed between the first stack STS1 and the second stack STS2. The upper surface of the peripheral source structure PSS and an upper surface of the second contact CT2 may be exposed between the second stack STS2 and the third stack STS3.

The first stack STS1 may include the first insulating patterns IP1 and fifth sacrificial patterns FP5 alternately stacked with each other in the third direction D3. The second stack STS2 may include the second insulating patterns IP2 and the first sacrificial patterns FP1 that are alternately stacked with each other in the third direction D3. The third stack STS3 may include the third insulating patterns IP3 and the third sacrificial patterns FP3 that are alternately stacked with each other in the third direction D3. The first to third insulating patterns IP1, IP2, and IP3 may be formed by pattering the insulating film IL of the preliminary stack rSTS. The first sacrificial pattern FP1, the third sacrificial pattern FP3, and the fifth sacrificial pattern FP5 may be formed by patterning the first sacrificial film FL1 of the preliminary stack rSTS.

The first stack STS1 may have the step shape structure STE. The first insulating patterns IP1 and the fifth sacrificial patterns FP5 may be formed in a step shape, and thus the step shape structure STE may be formed. According to patterning of the preliminary stack rSTS, the first stack STS1 having the step shape structure STE may be formed on the cell source structure CSS.

Figure 2E:
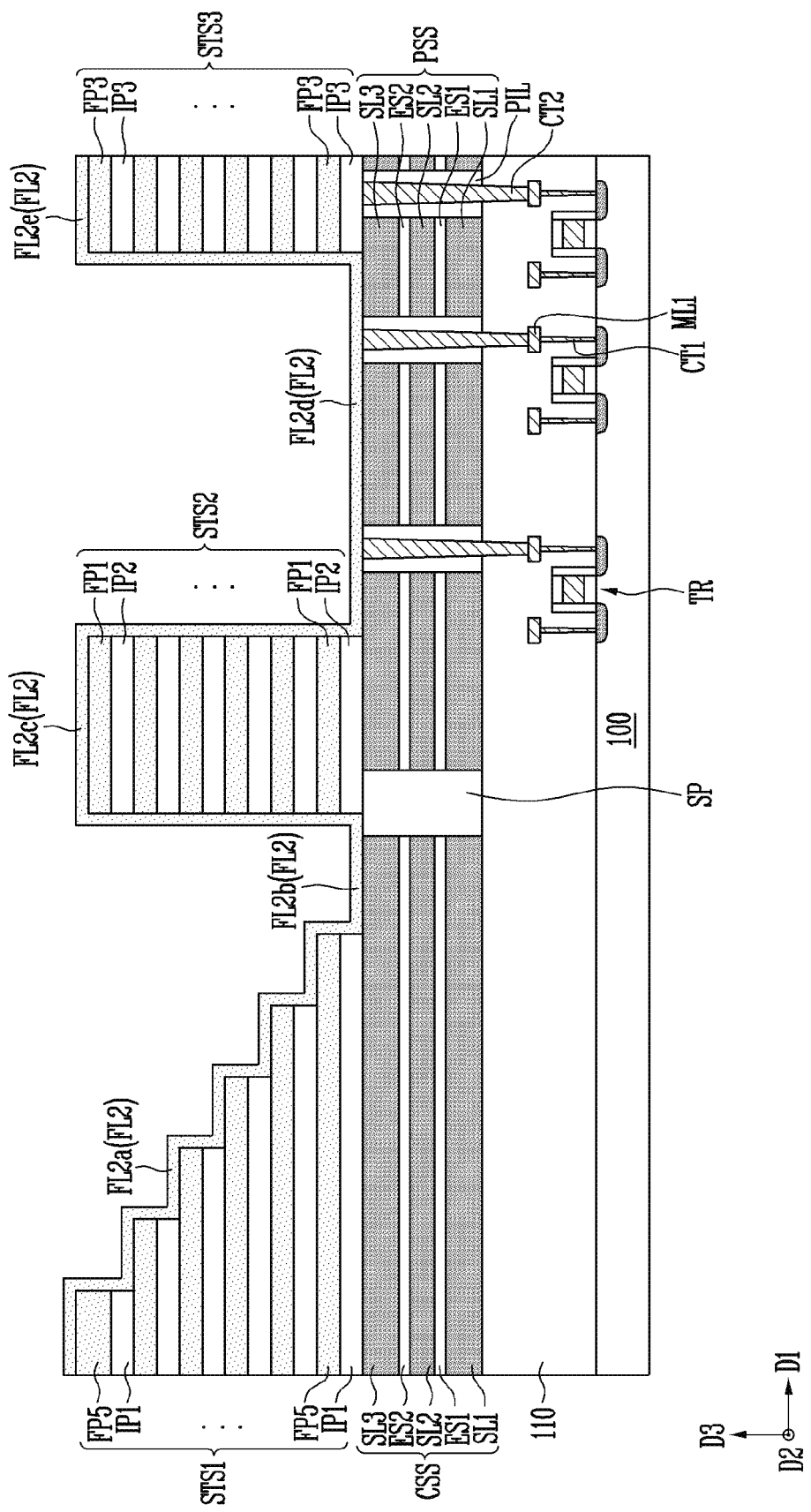

Referring to FIG. 2E, the second sacrificial film FL2 covering the first stack STS1, the second stack STS2, the third stack STS3, the cell source structure CSS, and the peripheral source structure PSS may be formed. The second sacrificial film FL2 may be conformally formed on surfaces of the first stack STS1, the second stack STS2, the third stack STS3, the cell source structure CSS, and the peripheral source structure PSS.

The second sacrificial film FL2 may include first to fifth portions FL2a, FL2b, FL2c, FL2d, and FL2e. The first portion FL2a may be a portion covering the surface of the first stack STS1, the second portion FL2b may be a portion covering the upper surface of the cell source structure CSS, the third portion FL2c may be a portion covering the upper surface of the second stack STS2, the fourth portion FL2d may be a portion covering the upper surface of the peripheral source structure PSS, and the fifth portion FL2e may be a portion covering the upper surface of the third stack STS3.

The second sacrificial film FL2 may include an insulating material. For example, the second sacrificial film FL2 may include nitride.

Figure 2F:
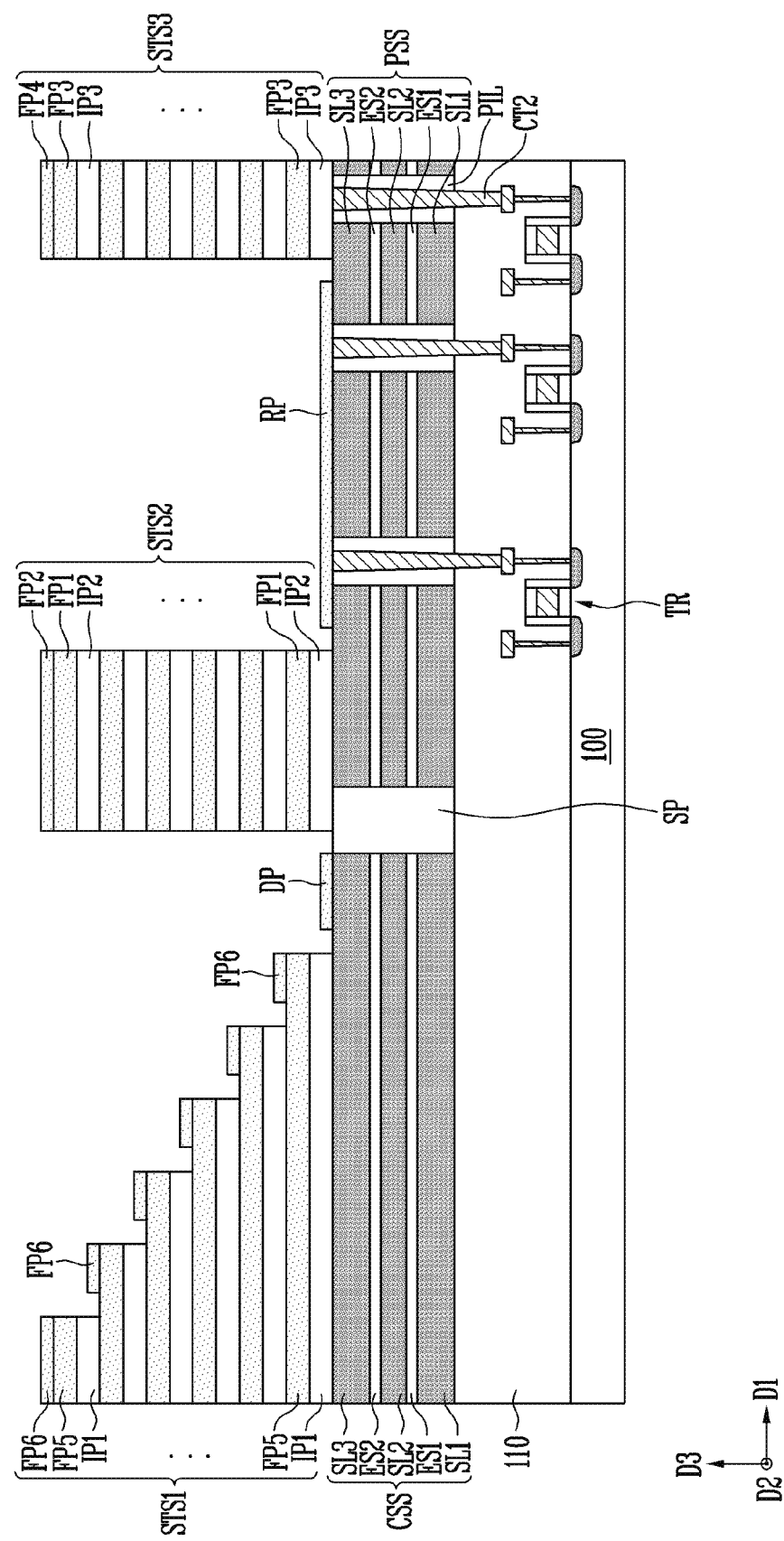

Referring to FIG. 2F, the second sacrificial film FL2 may be patterned. The second sacrificial pattern FP2, the fourth sacrificial pattern FP4, the sixth sacrificial patterns FP6, the dummy pattern DP, and the resistor pattern RP may be formed by patterning the second sacrificial film FL2. The second sacrificial film FL2 may be separated into the second sacrificial pattern FP2, the fourth sacrificial pattern FP4, the sixth sacrificial patterns FP6, the dummy pattern DP, and the resistor pattern RP.

The sixth sacrificial patterns FP6 may be formed by patterning the first portion FL2a of the second sacrificial film FL2. The dummy pattern DP may be formed by patterning the second portion FL2b of the second sacrificial film FL2. The second sacrificial pattern FP2 may be formed by patterning the third portion FL2c of the second sacrificial film FL2. The resistor pattern RP may be formed by patterning the fourth portion FL2d of the second sacrificial film FL2. The fourth sacrificial pattern FP4 may be formed by patterning the fifth portion FL2e of the second sacrificial film FL2.

In the second sacrificial film FL2, the second sacrificial pattern FP2, the fourth sacrificial pattern FP4, the sixth sacrificial patterns FP6, the dummy pattern DP, and the resistor pattern RP may be formed by removing portions formed along sidewalls of the first to third stacks STS1, STS2, and STS3. For example, the second sacrificial film FL2 may be patterned by an etching process. For example, the etching process may be a wet etching process.

The second sacrificial pattern FP2 may be formed on the second stack STS2. After formation of the second sacrificial pattern FP2, the second stack STS2 may be defined as including the first sacrificial patterns FP1, the second sacrificial pattern FP2, and the second insulating patterns IP2.

The fourth sacrificial pattern FP4 may be formed on the third stack STS3. After formation of the fourth sacrificial pattern FP4, the third stack STS3 may be defined as including the third sacrificial patterns FP3, the fourth sacrificial pattern FP4, and the third insulating patterns IP3.

The sixth sacrificial patterns FP6 may be formed on the first stack STS1. After formation of the sixth sacrificial patterns FP6, the first stack STS1 may be defined as including the first insulating patterns IP1, the fifth sacrificial patterns FP5, and the sixth sacrificial patterns FP6.

Each of the sixth sacrificial patterns FP6 may be formed on each of the fifth sacrificial patterns FP5. The sixth sacrificial pattern FP6 may be formed on an exposed upper surface of the fifth sacrificial pattern FP5. The exposed upper surface of the fifth sacrificial pattern FP5 might not be covered by the first insulating pattern IP1.

The sixth sacrificial patterns FP6 may be spaced apart from each other in the first direction D1. The sixth sacrificial patterns FP6 may be spaced apart from each other in the third direction D3. The sixth sacrificial pattern FP6 may be spaced apart from the first insulating pattern IP1 disposed at the same level, in the first direction D1. A portion of the upper surface of the fifth sacrificial pattern FP5 may be exposed between the sixth sacrificial pattern FP6 and the first insulating pattern IP1 disposed at the same level as the sixth sacrificial pattern FP6.

The dummy pattern DP may be formed on the cell source structure CSS. The dummy pattern DP may be formed between the first stack STS1 and the second stack STS2. The dummy patterns DP may be spaced apart from the first stack STS1 in the first direction D1. The dummy patterns DP may be spaced apart from the second stack STS2 in the first direction D1.

The dummy pattern DP may be formed at the same level as the first insulating pattern IP1 of the lowermost portion of the first stack STS1. The level of the lower surface of the dummy pattern DP may be the same as the level of the lower surfaces of the first to third stacks STS1, STS2, and STS3. The level of the lower surface of the dummy pattern DP may be the same as the level of the lower surface of the first insulating pattern IP1 of the lowermost portion of the first stack STS1. The level of the upper surface of the dummy pattern DP may be lower than the level of the upper surface of the first insulating pattern IP1 of the lowermost portion of the first stack STS1.

The resistor pattern RP may be formed on the peripheral source structure PSS. The resistor pattern RP may be formed between the second stack STS2 and the third stack STS3. The resistor pattern RP may be spaced apart from the second stack STS2 in the first direction D1. The resistor pattern RP may be spaced apart from the third stack STS3 in the first direction D1.

The resistor pattern RP may be formed at the same level as the first insulating pattern IP1 of the first stack STS1. The level of the lower surface of the resistor pattern RP may be the same as the level of the lower surfaces of the first to third stacks STS1, STS2, and STS3. The level of the lower surface of the resistor pattern RP may be the same as the level of the lower surface of the first insulating pattern IP1 of the lowermost portion of the first stack STS1. The level of the upper surface of the resistor pattern RP may be lower than the level of the upper surface of the first insulating pattern IP1 of the lowermost portion of the first stack STS1.

The resistor pattern RP may be connected to the second contacts CT2.

Figure 2G:
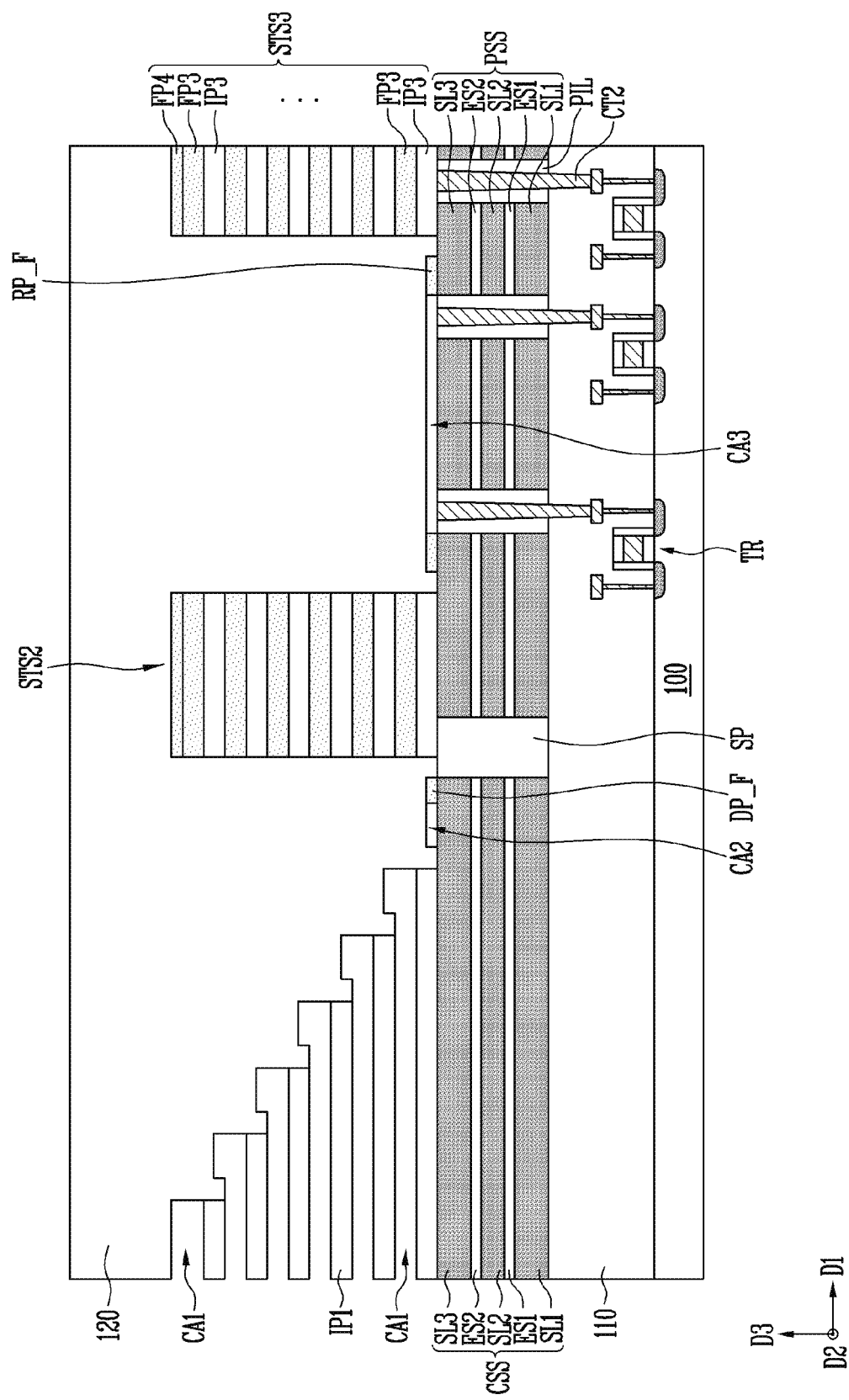
Figure 2H:
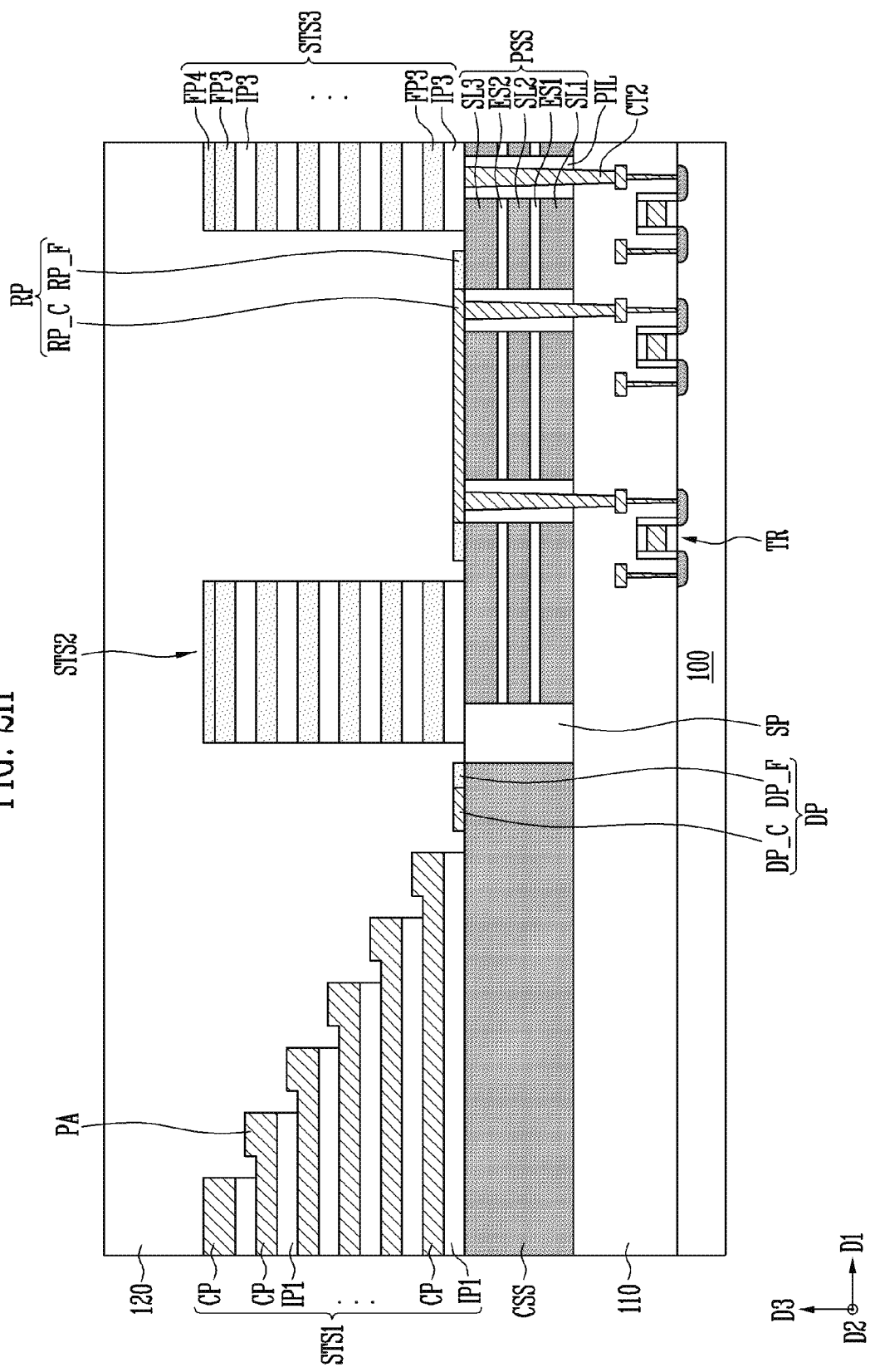

Referring to FIGS. 2G and 2H, the fifth and sixth sacrificial patterns FP5 and FP6 of the first stack STS1 may be replaced with the conductive patterns CP, the first conductive portion DP_C may be formed in the dummy pattern DP, and the second conductive portion RP_C may be formed in the resistor pattern RP. Formation of the conductive patterns CP, the first conductive portion DP_C, and the second conductive portion RP_C will be described below.

Referring to FIG. 2G, the second insulating film 120 covering the first to third stacks STS1, STS2, and STS3, the cell source structure CSS, and the peripheral source structure PSS may be formed.

Subsequently, the fifth and sixth sacrificial patterns FP5 and FP6 of the first stack STS1, a portion of the dummy pattern DP, and a portion of the resistor pattern RP may be removed.

Removing the fifth and sixth sacrificial patterns FP5 and FP6 and the portion of the dummy pattern DP may include forming a second trench exposing the fifth and sixth sacrificial patterns FP5 and FP6 and the dummy pattern DP, and removing the fifth and sixth sacrificial patterns FP5 and FP6 and the portion of the dummy pattern DP through the second trench.

The second trench may extend in the first direction D1. The second trench may pass through the second insulating film 120 and the first stack STS1 in the third direction D3. The second trench may be connected to the cell source structure CSS. For example, the fifth and sixth sacrificial patterns FP5 and FP6 and the portion of the dummy pattern DP may be removed, by injecting an etching material capable of etching the fifth and sixth sacrificial patterns FP5 and FP6 and the dummy pattern DP through the second trench.

An empty space formed as the fifth and sixth sacrificial patterns FP5 and FP6 are removed may be defined as first cavities CA1. An empty space formed as the portion of the dummy pattern DP is removed may be defined as a second cavity CA2. A portion that is not removed from the dummy pattern DP may be defined as the first sacrificial portion DP_F.

Removing a portion of the resistor pattern RP may include forming a third trench exposing the resistor pattern RP, and removing the portion of the resistor pattern RP through the third trench.

The third trench may extend in the first direction D1. The third trench may be spaced apart from the second trench in the first direction D1. The second stack STS2 may be disposed between the third trench and the second trench. The third trench may pass through the second insulating film 120 in the third direction D3. For example, the portion of the resistor pattern RP may be removed by injecting an etching material capable of etching the resistor pattern RP through the third trench.

An empty space formed as the portion of the resistor pattern RP is removed may be defined as a third cavity CA3. A portion that is not removed from the resistor pattern RP may be defined as the second sacrificial portions RP_F. The third cavity CA3 may be disposed between the second sacrificial portions RP_F. The third cavity CA3 may be connected to the second contacts CT2. The second contacts CT2 may be exposed by the third cavity CA3.

For example, the second trench and the third trench may be simultaneously formed. For example, the fifth and sixth sacrificial patterns FP5 and FP6, the portion of the dummy pattern DP, and the portion of the resistor pattern RP may be simultaneously removed. For example, the first to third cavities CA1, CA2, and CA3 may be simultaneously formed. The words "simultaneous" and "simultaneously" as used herein with respect to occurrences mean that the occurrences take place on overlapping intervals of time. For example, if a first occurrence takes place over a first interval of time and a second occurrence takes place simultaneously over a second interval of time, then the first and second intervals at least partially overlap each other such that there exists a time at which the first and second occurrences are both taking place.

Referring to FIG. 2H, the second source film SL2 and the first and second etch stop films ES1 and ES2 of the cell source structure CSS may be removed, and a semiconductor material may be formed in the empty space formed by removing the second source film SL2 and the first and second etch stop films ES1 and ES2. The second source film SL2 and the first and second etch stop films ES1 and ES2 of the cell source structure CSS may be removed through the second trench. As the semiconductor material is formed, the cell source structure CSS may be formed as a single film or multiple films.

The conductive patterns CP may be formed in the first cavities CA1. The conductive patterns CP may be formed in the first cavity CA1 through the second trench. The first conductive portion DP_C may be formed in the second cavity CA2. The first conductive portion DP_C may be formed in the second cavity CA2 through the second trench. The second conductive portion RP_C may be formed in the third cavities CA3. The second conductive portion RP_C may be formed in the third cavity CA3 through the third trench.

For example, the conductive patterns CP, the first conductive portion DP_C, and the second conductive portion RP_C may be simultaneously formed. For example, the conductive patterns CP, the first conductive portion DP_C, and the second conductive portion RP_C may include the same material.

According to formation of the first conductive portion DP_C, the dummy pattern DP including the first conductive portion DP_C and the first sacrificial portion DP_F may be formed. According to formation of the second conductive portion RP_C, the resistor pattern RP including the second conductive portion RP_C and the second sacrificial portions RP_F may be formed.

A portion the conductive patterns CP may include the pad portion PA. The pad portion PA may be a portion filling an empty space formed by removing the sixth sacrificial pattern FP6.

The method of manufacturing the semiconductor device according to an embodiment may form the resistor pattern RP using the second sacrificial film FL2 for forming the pad portion PA of the conductive pattern CP. The second conductive portion RP_C of the resistor pattern RP may be used as a portion of the configurations of the resistor of the semiconductor device. Since the second conductive portion RP_C of the resistor pattern RP is used as one portion of the configurations of the resistor of the semiconductor device, time and cost of a process of manufacturing the semiconductor device may be saved, and space utilization of the semiconductor device may be improved. Accordingly, operation reliability of the semiconductor device may be improved.

Figure 3:
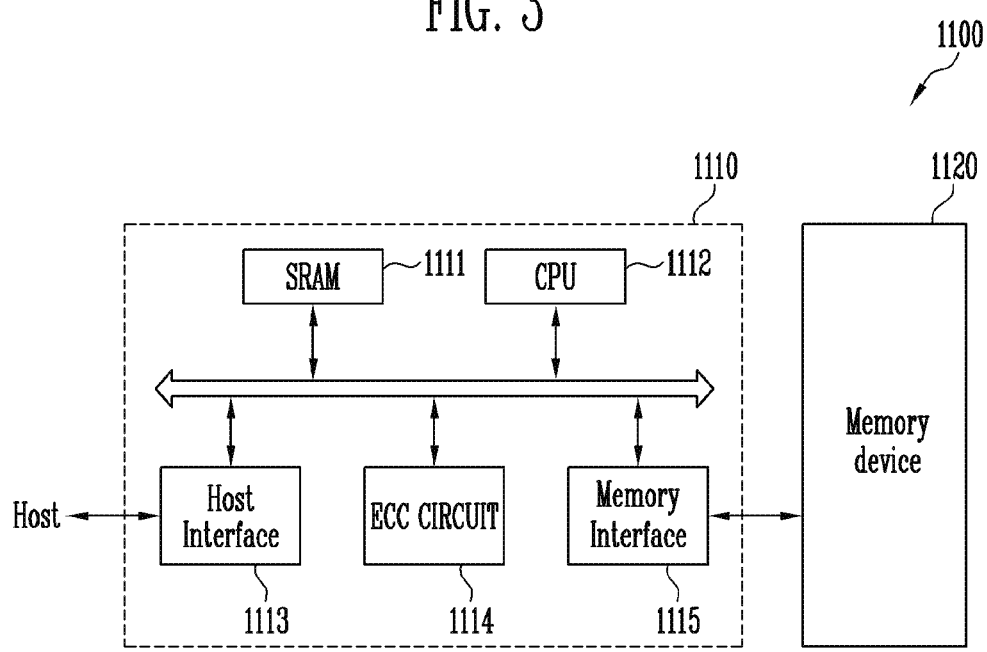
FIG. 3 is a block diagram illustrating a configuration of a memory system according to an embodiment of the present disclosure.

FIG. 3 is a block diagram illustrating a configuration of a memory system according to an embodiment of the present disclosure.

Referring to FIG. 3, the memory system 1100 according to an embodiment of the present disclosure includes a memory device 1120 and a memory controller 1110.

The memory device 1120 may include the structures described with reference to FIGS. 1A and 1B. The memory device 1120 may be a multi-chip package configured of a plurality of flash memory chips.

The memory controller 1110 may be configured to control the memory device 1120, and may include a static random access memory (SRAM) 1111, a central processing unit (CPU) 1112, a host interface 1113, and an error correction code (ECC) circuit 1114, and a memory interface 1115. The SRAM 1111 is used as an operation memory of the CPU 1112, the CPU 1112 performs various control operations for exchanging data of the memory controller 1110, and the host interface 1113 includes a data exchange protocol of a host that is connected to the memory system 1100. In addition, the ECC circuit 1114 detects and corrects an error included in data read from the memory device 1120, and the memory interface 1115 performs an interfacing with the memory device 1120. In addition, the memory controller 1110 may further include a read only memory (ROM) or the like for storing code data for interfacing with the host.

The memory system 1100 described above may be a memory card or a solid state disk (SSD) in which the memory device 1120 and the memory controller 1110 are combined to each other. For example, when the memory system 1100 is an SSD, the memory controller 1110 may communicate with the outside (for example, the host) through at least one of various interface protocols such as a universal serial bus (USB), a multimedia card (MMC), a peripheral component interconnection-express (PCI-E), a serial advanced technology attachment (SATA), a parallel advanced technology attachment (PATA), a small computer small interface (SCSI), an enhanced small disk interface (ESDI), and integrated drive electronics (IDE).

Figure 4:
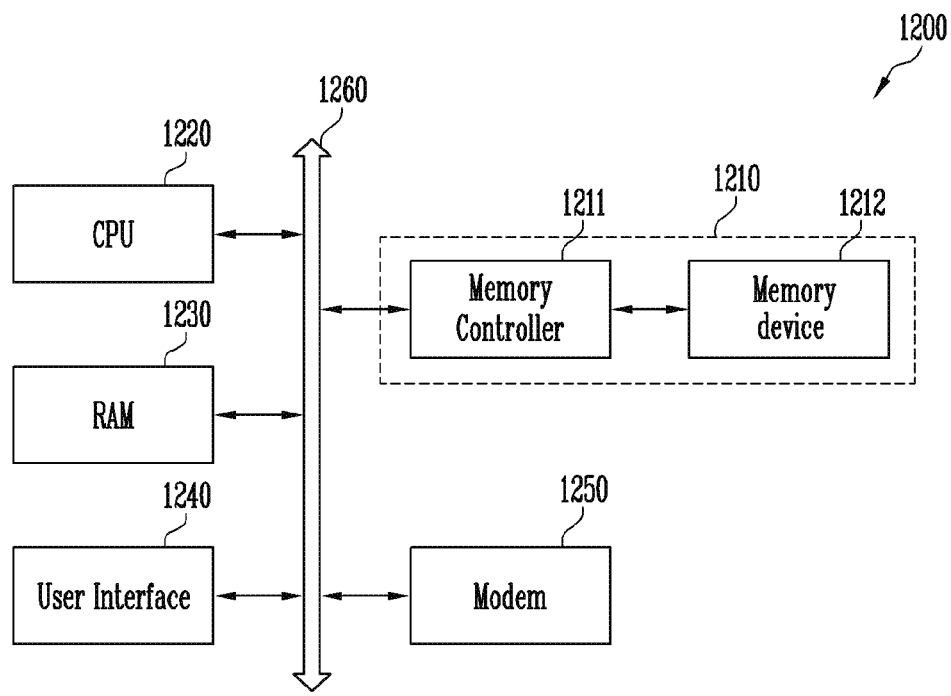
FIG. 4 is a block diagram illustrating a configuration of a computing system according to an embodiment of the present disclosure.

FIG. 4 is a block diagram illustrating a configuration of a computing system according to an embodiment of the present disclosure.

Referring to FIG. 4, the computing system 1200 according to an embodiment of the present disclosure may include a CPU 1220, a random access memory (RAM) 1230, a user interface 1240, a modem 1250, and a memory system 1210, which are electrically connected to a system bus 1260. In addition, when the computing system 1200 is a mobile device, a battery for supplying an operation voltage to the computing system 1200 may be further included, and an application chipset, a camera image processor (CIS), a mobile DRAM, and the like may be further included.

The memory system 1210 may be configured of a memory device 1212 and a memory controller 1211 as described with reference to FIG. 3.

What is claimed is:

1. A semiconductor device comprising:
a cell source structure;
a first stack disposed on the cell source structure and including insulating patterns and conductive patterns that are alternately stacked with each other;
a peripheral source structure; and
a resistor pattern disposed on the peripheral source structure,
wherein the resistor pattern is disposed at substantially the same level as a lowermost insulating pattern of the first stack.

2. The semiconductor device of claim 1, wherein the resistor pattern includes a conductive portion and sacrificial portions disposed on both sides of the conductive portion.

3. The semiconductor device of claim 2, wherein the conductive portion includes a conductive material, and the sacrificial portions include an insulating material.

4. The semiconductor device of claim 2,
wherein the conductive patterns of the first stack include a first material and the conductive portion of the resistor pattern includes a second material, and
wherein the first material is substantially the same as the second material.

5. The semiconductor device of claim 4, wherein the first and second materials include a conductive film and a barrier film.

6. The semiconductor device of claim 5, wherein the barrier film includes at least one a titanium nitride and a tantalum nitride.

7. The semiconductor device of claim 1, further comprising:
a second contact passing through the peripheral source structure,
wherein the resistor pattern is connected to the second contact.

8. The semiconductor device of claim 7, further comprising:

a peripheral transistor electrically connected to the resistor pattern through the second contact.

9. The semiconductor device of claim 8, wherein the peripheral transistor is disposed under the peripheral source structure.

10. The semiconductor device of claim 1, further comprising:
a spacer between the cell source structure and the peripheral source structure,
wherein the cell source structure and the peripheral source structure are spaced apart from each other by the spacer.

11. The semiconductor device of claim 1, further comprising:
a second stack between the first stack and the resistor pattern.

12. The semiconductor device of claim 11, further comprising:
a dummy pattern between the first stack and the second stack.

13. A semiconductor device comprising:
a peripheral transistor;
an insulating film covering the peripheral transistor;
a cell source structure and a peripheral source structure on the insulating film;
a first stack disposed on the cell source structure and including insulating patterns and conductive patterns that are alternately stacked with each other;
a resistor pattern on the peripheral source structure; and
a contact passing through the peripheral source structure to electrically connect the peripheral transistor and the resistor pattern to each other.

14. The semiconductor device of claim 13, further comprising:
a dummy pattern between the resistor pattern and the first stack,
wherein the dummy pattern includes a first conductive portion adjacent to the first stack and a first sacrificial portion adjacent to the resistor pattern.

15. The semiconductor device of claim 14, wherein the first conductive portion includes substantially the same material as the conductive patterns.

16. The semiconductor device of claim 13, wherein the resistor pattern includes a second conductive portion connected to the contact and second sacrificial portions disposed on both sides of the second conductive portion.

17. The semiconductor device of claim 16, wherein the second conductive portion includes substantially the same material as the conductive patterns.

18. The semiconductor device of claim 13, wherein each of the conductive patterns comprises:
an exposed upper surface that is not covered by the insulating patterns; and
a pad portion protruding from the exposed upper surface.

19. The semiconductor device of claim 13, wherein the peripheral source structure comprises:
a first source film on the insulating film;
a first etch stop film on the first source film;
a second source film on the first etch stop film;
a second etch stop film on the second source film; and
a third source film on the second etch stop film.

20. The semiconductor device of claim 13, further comprising:
a through insulating film passing through the peripheral source structure,
wherein the contact passes through the through insulating film.

* * * * *